United States Patent
Englhard

(10) Patent No.: US 10,950,746 B2
(45) Date of Patent: Mar. 16, 2021

(54) METHOD FOR PRODUCING A PLURALITY OF OPTOELECTRONIC COMPONENTS, AND OPTOELECTRONIC COMPONENT

(71) Applicant: OSRAM Opto Semiconductors GmbH, Regensburg (DE)

(72) Inventor: Marco Englhard, Illschwang (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/484,553

(22) PCT Filed: Feb. 2, 2018

(86) PCT No.: PCT/EP2018/052666
§ 371 (c)(1),
(2) Date: Aug. 8, 2019

(87) PCT Pub. No.: WO2018/149666
PCT Pub. Date: Aug. 23, 2018

(65) Prior Publication Data
US 2020/0035854 A1  Jan. 30, 2020

(30) Foreign Application Priority Data
Feb. 15, 2017   (DE) ..................... 10 2017 103 041.7

(51) Int. Cl.
*H01L 33/00* (2010.01)
*H01L 33/30* (2010.01)
(52) U.S. Cl.
CPC ...... *H01L 33/0066* (2013.01); *H01L 33/0095* (2013.01); *H01L 33/30* (2013.01);
(Continued)
(58) Field of Classification Search
None
See application file for complete search history.

(56) References Cited

U.S. PATENT DOCUMENTS 8,956,897 B2   2/2015 Rode et al.
9,799,801 B2  10/2017 Schmid et al.
(Continued)

FOREIGN PATENT DOCUMENTS

DE   102008030584 A1   12/2009
DE   102013105035 A    11/2014
(Continued)

OTHER PUBLICATIONS

Englhard, M. et al., "Characterization of Reclaimed GaAs Substrates and Investigation of Reuse for Thin Film InGaAlP LED Epitaxial Growth," Journal of Applied Physics, 120, 2016, 7 pages.
(Continued)

*Primary Examiner* — Jay C Chang
(74) *Attorney, Agent, or Firm* — Slater Matsil, LLP

(57) ABSTRACT

A method for producing a plurality of optoelectronic components are disclosed. In an embodiment, the method includes providing a substrate, epitaxially applying a sacrificial layer on the substrate, wherein the sacrificial layer has a layer thickness greater than 300 nm and comprises $Al_xGa_{(1-x)}As$ with $0<x\leq 1$, epitaxially applying a semiconductor layer sequence on the sacrificial layer, forming trenches extending in a vertical direction through the semiconductor layer sequence to the sacrificial layer such that a plurality of regions in the semiconductor layer sequence is formed and wet thermally oxidizing the sacrificial layer such that the substrate is non-destructively removable from the semiconductor layer sequence, wherein the sacrificial layer comprises at least three and optionally four sublayers in a direction facing away from the substrate, a first sublayer comprising InGaAlP, a second sublayer comprising GaAs, a third sublayer comprising $Al_xGa_{(1-x)}As$ with $0<x\leq 1$ and a fourth sublayer comprising GaAs.

17 Claims, 11 Drawing Sheets

(52) U.S. Cl.
CPC .......... *H01L 2933/0025* (2013.01); *H01L 2933/0033* (2013.01)

(56) References Cited

U.S. PATENT DOCUMENTS

| | | |
|---|---|---|
| 2011/0159624 A1 | 6/2011 | Chen et al. |
| 2016/0104819 A1* | 4/2016 | Schmid .......... H01L 33/24 438/26 |

FOREIGN PATENT DOCUMENTS

| | | |
|---|---|---|
| JP | 2013004632 A | 1/2013 |
| WO | 2014184240 A1 | 11/2014 |

OTHER PUBLICATIONS

Oktyabrsky, S. et al., "Oxidation Lift-Off Method for Layer Transfer of GaAs AlAs-Based Structures," Applied Physics Letters, vol. 85, No. 1, Jul. 5, 2004, 3 pages.

Oktyabrsky, S. et al., "Oxidation Lift-Off Technology," Proceedings of SPIE, Optoelectronic Integration on Silicon II, vol. 5730, 2005, 9 pages.

\* cited by examiner

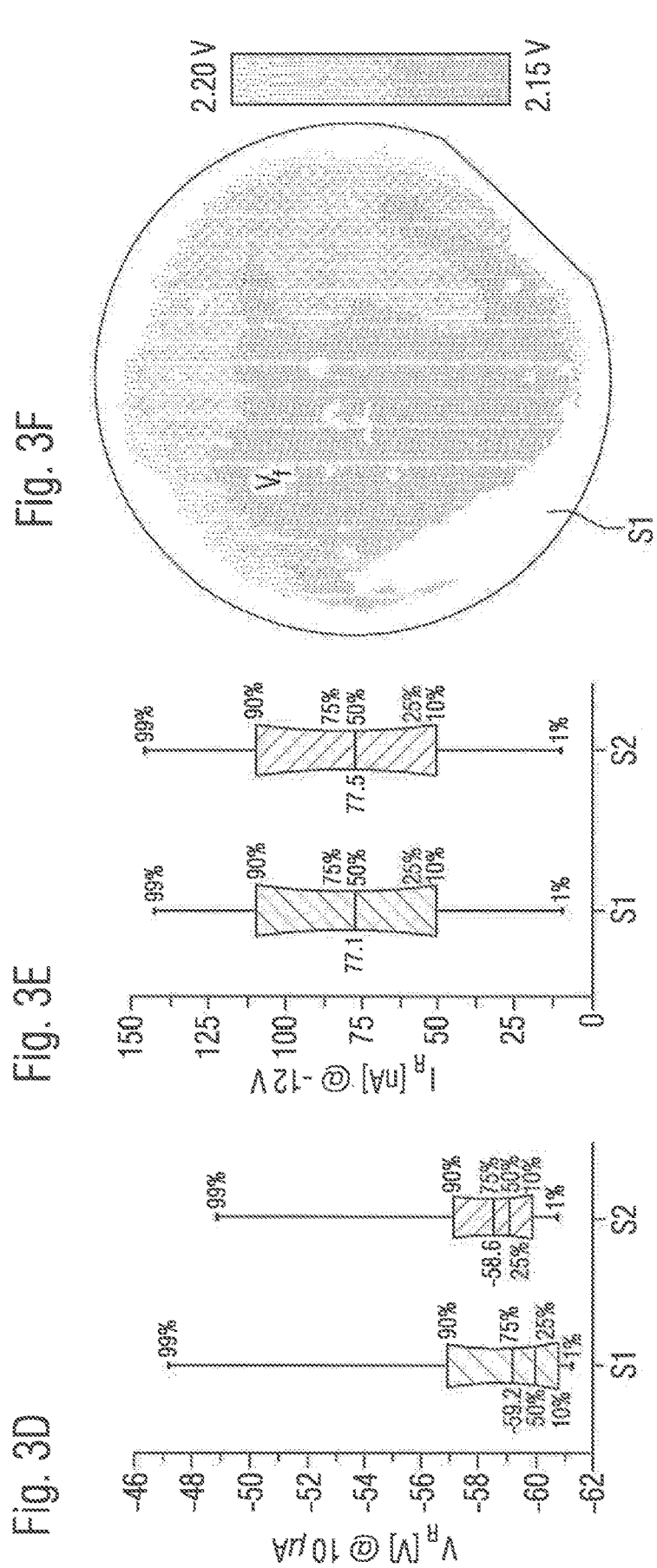

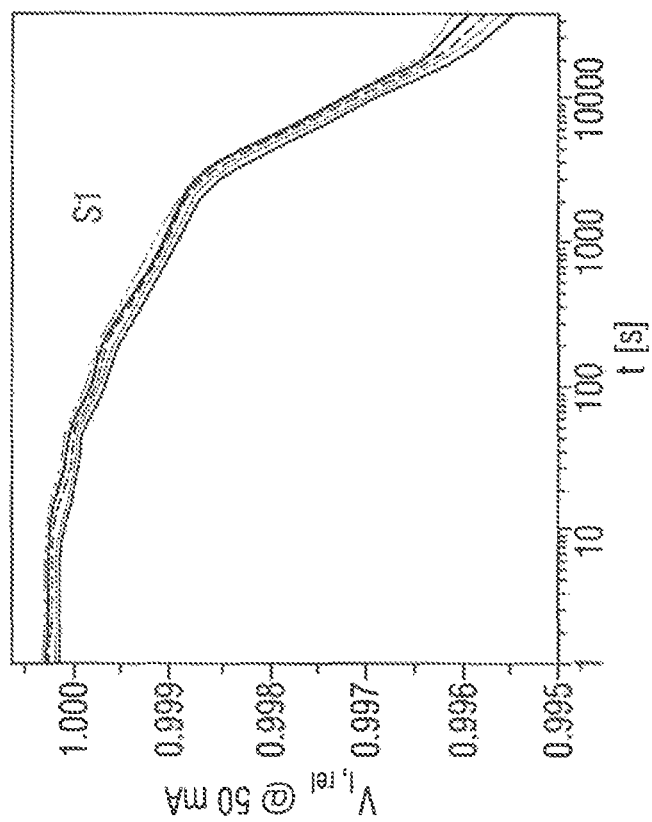
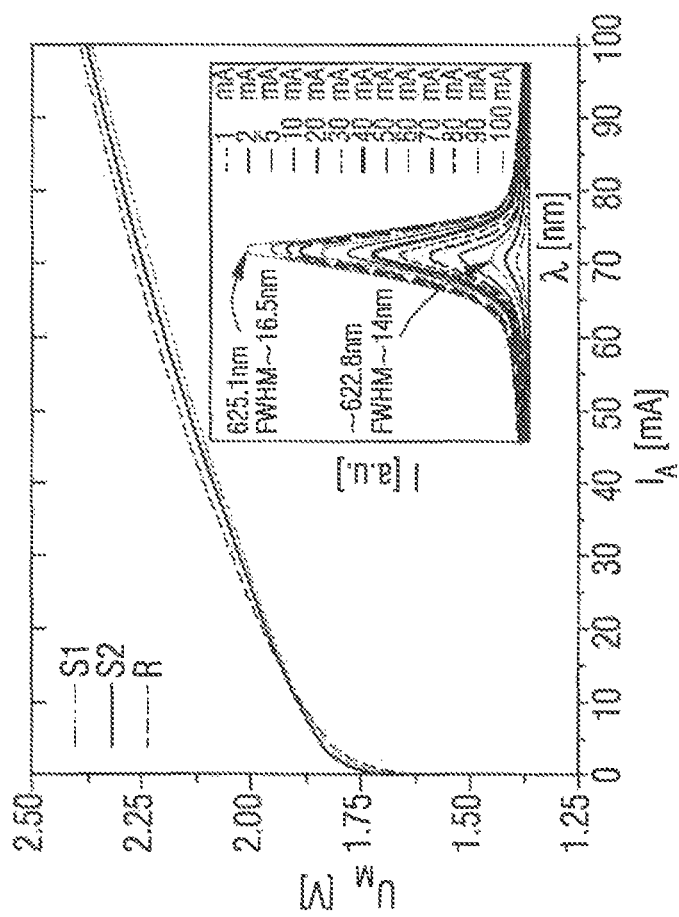
Fig. 4A
Fig. 4B

1

METHOD FOR PRODUCING A PLURALITY OF OPTOELECTRONIC COMPONENTS, AND OPTOELECTRONIC COMPONENT

This patent application is a national phase filing under section 371 of PCT/EP2018/052666, filed Feb. 2, 2018, which claims the priority of German patent application 102017103041.7, filed Feb. 15, 2017, each of which is incorporated herein by reference in its entirety.

TECHNICAL FIELD

The invention relates to a method for producing a plurality of optoelectronic components. Furthermore, the invention relates to an optoelectronic component.

BACKGROUND

The reuse of substrates, in particular gallium arsenide substrates, is a key element in significantly reducing production costs. The substrate, which is in particular a growth substrate, is bonded to an auxiliary carrier with the corresponding semiconductor layer sequence in the finishing process. After bonding, the substrate is completely removed from the auxiliary carrier by a grinding process and wet chemical etching. The substrate is destroyed and cannot be reused.

SUMMARY OF THE INVENTION

Embodiments provide a method for producing a plurality of optoelectronic components that enables the substrate to be easily detached from the semiconductor layer sequence. In particular, the substrate is reusable after the method. Further embodiments provide a cost-effective optoelectronic component.

In at least one embodiment, the method for producing a plurality of optoelectronic components comprises the steps: A) providing a substrate, B) epitaxially applying a sacrificial layer having a layer thickness greater than 300 or 600 nm on the substrate, wherein the sacrificial layer comprises $Al_xGa_{(1-x)}As$ with $0<x\leq1$, C) epitaxially applying a semiconductor layer sequence on the sacrificial layer, wherein subsequently trenches are formed which extend in vertical direction through the semiconductor layer sequence to the sacrificial layer such that a plurality of regions is formed in the semiconductor layer sequence, and D) wet thermal oxidation of the sacrificial layer such that the substrate can be non-destructively removed from the semiconductor layer sequence.

In addition, the sacrificial layer may have at least three and optionally four sublayers in the direction facing away from the substrate, wherein the first sublayer comprises InGaAlP, the second sublayer comprises GaAs, the third sublayer comprises $Al_xGa_{(1-x)}As$ with $0<x\leq1$ and the fourth sublayer comprises GaAs.

The inventor has recognized that the method described here can easily detach the substrate from the semiconductor layer sequence, whereby the substrate is reusable and/or has been non-destructively used. In contrast to previously used methods, which use grinding and etching of the substrate, the substrate is retained in this method and can be reused. The method is comparably fast compared to a chemical etching process and offers the advantage that a plurality of substrates, in particular more than 40 substrates, can be processed at the same time with a corresponding system configuration. In addition, the bonding to an auxiliary carrier and removal of the substrate takes place in a single method step, especially in the so-called bonder. The substrate detaches itself from the auxiliary carrier during the cooling process in the bonder.

According to at least one embodiment, the method involves step A), providing a substrate. The substrate is in particular a growth substrate. In particular, the substrate is formed from gallium arsenide.

The substrate can be reused after the method steps of the method described here have been carried out, whereby the method described here can be repeated using the same substrate. In particular, the substrate is non-destructive after method step C).

According to at least one embodiment, the method comprises a step B), epitaxial application of a sacrificial layer. The sacrificial layer is applied to the substrate. That a layer or element is placed or applied "on" or "over" another layer or element may mean here and in the following that one layer or element is placed directly in mechanical and/or electrical contact on the other layer or element. Furthermore, it may also mean that a layer or element is arranged indirectly on or above the other layer or element. Further layers and/or elements can then be arranged between one and the other layer or between one and the other element.

The sacrificial layer has a thickness greater than 300 nm or 600 nm. Preferably, the sacrificial layer comprises a layer thickness greater than or equal to 600 nm and less than or equal to 950 nm, in particular between 650 nm and 800 nm, in particular between 680 nm and 750 nm, preferably between 690 nm and 720 nm, for example, 700 nm. The sacrificial layer comprises $Al_xGa_{(1-x)}As$ with $0<x\leq1$. In particular, $0<x\leq1$ or $0.95\leq x<1$. In particular, the sacrificial layer consists of this aluminum gallium arsenide. In particular, x is 0.95, 0.96, 0.97, 0.98 or 0.99, preferably 0.98. In other words, aluminum gallium arsenide preferably comprises 2% gallium. The rest of the percentages is aluminum, apart from minor impurities in the ppm range. The materials of the sacrificial layer may have additional substances. For the sake of simplicity, however, only the essential substances of the crystal lattice of the sacrificial layer, for example, Al, As, Ga, In, N or P, are given, even if these may be partially replaced and/or supplemented by small quantities of other substances.

Alternatively or additionally, the thickness of the sacrificial layer shall be between 300 nm and 950 nm, inclusive. Alternatively or additionally, the thickness of the sacrificial layers shall be between 600 nm and 800 nm, inclusive, for example, 700 nm.

According to at least one embodiment, is $0.95\leq x\leq1$ and the layer thickness of the sacrificial layer is between 300 nm and 950 nm, inclusive.

According to at least one embodiment, both the substrate and the sacrificial layer comprise an arsenide. The sacrificial layer is epitaxially applied to the substrate. In other words, the sacrificial layer is epitaxially grown on the substrate. This refers to the growth of crystalline layers or crystalline substrates by applying the material on a chemically identical (homoepitaxial) or different (heteroepitaxial) monocrystalline support. The deposition can be carried out with metal organic gas phase epitaxy (MOVPE).

According to at least one embodiment, the sacrificial layer comprises sublayers. In particular, the sacrificial layer has two sublayers. The first sublayer comprises $Al_xGa_{(1-x)}As$ with $0<x\leq1$. The second layer comprises gallium arsenide and/or indium gallium aluminum phosphide. In the case of the second sublayer comprising gallium arsenide, the first sublayer is located between the substrate and the second sublayer. In the case of the second layer comprising indium gallium aluminum phosphide, the second sublayer is located between the first sublayer and the substrate.

According to at least one embodiment, the sacrificial layer comprises two sublayers. The first sublayer comprises $Al_xGa_{(1-x)}As$ with $0<x<1$. The second sublayer comprises $Al_xGa_{(1-x)}As$ with $0<x<1$, whereby the content of Al in the first sublayer is greater than in the second sublayer, whereby the second sublayer is arranged between the substrate and the first sublayer. In particular, the first sublayer comprises an Al content of 98%. In particular, the second sublayer comprises an Al content of 10% to 70%. The second sublayer can be selectively removed by etching after the separation process from the surrounding layers.

In addition, the sacrificial layer may comprise a third sublayer arranged between the first sublayer and the semiconductor layer sequence, wherein the third sublayer comprises aluminum gallium arsenide or gallium arsenide.

In addition to the first, second and third sublayer, the sacrificial layer may comprise a fourth sublayer comprising InGaAlP with, for example, 55% Al content. In particular, the fourth sublayer comprises $In_{0.5}(Al_{0.275}Ga_{0.225})_{0.5}P$.

According to at least one embodiment, the sacrificial layer has at least three or exactly four sublayers in the direction away from the substrate. The first sublayer comprises indium gallium aluminum phosphide. The second sublayer is arranged over the first layer and comprises gallium arsenide. The third sublayer comprises aluminum gallium arsenide $(Al_xGa_{(1-x)}As)$ with $0<x\leq1$. The fourth sublayer comprises gallium arsenide. The first sublayer is arranged above the substrate, followed by the second sublayer, the third sublayer and, if necessary, the fourth sublayer in the direction away from the substrate.

According to at least one embodiment, the first sublayer serves as a protective layer for the substrate. The first sublayer comprises a layer thickness of 1 nm to 350 nm, in particular between 10 nm and 300 nm, for example, 250 nm. The second sublayer comprises a layer thickness of 1 nm to 500 nm, in particular 100 nm to 300 nm, for example, 250 nm. The fourth sublayer serves as a protective layer for the semiconductor layer sequence. The fourth sublayer comprises a layer thickness of 1 nm to 120 nm, for example, 40 nm to 80 nm, for example, 50 nm.

According to at least one embodiment, the method comprises a step C), epitaxial application of the semiconductor layer sequence to the sacrificial layer, wherein trenches are subsequently created. The trenches, also called mesa trenches, extend vertically through the semiconductor layer sequence to the sacrificial layer. Preferably, the trenches extend to the sacrificial layer and expose the sacrificial layer, so that a subsequent wet thermal oxidation of the sacrificial layer is possible. This produces a plurality of regions of the semiconductor layer sequence. Preferably, the regions of the semiconductor layer sequence form the plurality of optoelectronic components. The optoelectronic components are functional here. In other words, the optoelectronic components comprise the ability to emit electromagnetic radiation during operation.

According to at least one embodiment, the semiconductor layer sequence is formed as a thin-film chip.

According to at least one embodiment, the plurality of optoelectronic components has a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein respectively $0\leq n\leq 1$, $0\leq m\leq 1$ and $n+m\leq 1$. The semiconductor layer sequence may comprise dopants as well as additional components. For the sake of simplicity, however, only the essential components of the crystal lattice of the semiconductor layer sequence are indicated, such as Al, As, Ga, In, N or P, even if these may be partially replaced and/or supplemented by small quantities of other substances. Preferably, the semiconductor layer sequence comprises an arsenide compound semiconductor material.

The semiconductor layer sequence includes an active layer with at least one pn junction and/or with one or more quantum well structures. During operation of the semiconductor layer sequence, electromagnetic radiation is generated in the active layer. The semiconductor layer sequence is therefore designed to emit radiation during operation. A wavelength, maximum wavelength or peak wavelength of radiation is preferably in the ultraviolet and/or visible spectral range, in particular at wavelengths between 420 nm and 680 nm, inclusive, for example, between 440 nm and 480 nm, inclusive.

In particular, the semiconductor layer sequence comprises an indium gallium aluminum phosphide multiple quantum well structure. The semiconductor layer sequence may comprise p-contact, buried microreflector (BMR), reflective mirror surfaces and/or multi-layer bond metallization. After method step C) or D), the arrangement can be transferred to an auxiliary carrier, in particular made of germanium.

The trenches extend vertically through the semiconductor layer sequence, i.e., through an n-doped semiconductor layer, through the active layer and a p-doped semiconductor layer to the sacrificial layer. Preferably, these trenches extend to the substrate, i.e., they cut vertically through the sacrificial layer partially, completely or regionally. A plurality of regions of the semiconductor layer sequence are thus formed, which ultimately form the optoelectronic components. The trenches can be created by etching. Thus, a pre-structured semiconductor layer sequence can be generated in top view of the arrangement. In the subsequent process, the pre-structured semiconductor layer sequence can be oxidized by wet thermal oxidation so that lateral oxidation of the sacrificial layer takes place from the semiconductor layer sequence side surfaces or flanks.

According to at least one embodiment, the method comprises a step D), wet thermal oxidation of the sacrificial layer, so that the substrate can be non-destructively removed from the semiconductor layer sequence. In other words, by oxidizing the sacrificial layer, the semiconductor layer sequence can be non-destructively removed from the substrate by an oxidative lift-off method. The substrate can be reused in subsequent method steps.

In particular, wet thermal oxidation here and in the following means that the sacrificial layer is oxidized under the influence of moisture and/or temperatures. For example, the sacrificial layer, which is made of aluminum gallium arsenide, can be oxidized to aluminum oxide with different stoichiometry and composition. Oxidation to aluminum hydroxide is also conceivable, either additionally or alternatively.

According to at least one embodiment, step D) takes place at a temperature of <400° C., in particular <380° C., for example, 360° C. Alternatively or additionally, step D) is carried out under a steam atmosphere.

According to at least one embodiment, the sacrificial layer is completely oxidized and the adhesion of the oxidizing sacrificial layer is smaller than the adhesion of the non-oxidized sacrificial layer. Due to the wet thermal oxidation of the sacrificial layer, for example, aluminum gallium arsenide, a reduced adhesion of the sacrificial layer to its surrounding is produced. This allows the oxidized sacrificial layer to be easily removed in a subsequent method step, such as an etching step, so that the substrate can easily be separated from the semiconductor layer sequence.

According to at least one embodiment, the sacrificial layer in step D) is only partially oxidized, so that there are non-oxidized regions between the semiconductor layer sequence and the substrate that have $Al_xGa_{(1-x)}As$ with x<1. The non-oxidized regions can create a light bond between the substrate and the semiconductor layer sequence to keep the components in place during production. The compound is so weak that it can easily be dissolved in subsequent processes.

According to at least one embodiment, the sacrificial layer can be completely laterally oxidized. The semi-finished chip structures above can remain in the intended position. This prevents defects or breakouts. Depending on chip size and geometry, only this region can be laterally oxidized. In this case, lateral oxidation of ~140 µm can be performed from each chip edge.

According to at least one embodiment, the areas of the semiconductor layer sequences are arranged in matrix form.

After step C) and/or D), an auxiliary carrier is applied to the side of the semiconductor layer sequence opposite the substrate according to at least one embodiment. In other words, the auxiliary carrier is applied to the side opposite the main radiation exit surface of the semiconductor layer sequence. The main radiation exit surface is the area of the semiconductor layer sequence over which most or all of the radiation generated by the semiconductor layer sequence is decoupled from the semiconductor layer sequence. The main radiation exit surface is oriented in particular perpendicular to the growth direction of the semiconductor layer sequence.

According to at least one embodiment, the auxiliary carrier and the semiconductor layer sequence are removed from the substrate. The auxiliary carrier can then be separated so that a plurality of optoelectronic components can be produced. The plurality of optoelectronic components at least has the auxiliary carrier and the semiconductor layer sequence. The auxiliary carrier can be further processed before or after separation. For example, the surface can be roughened to enable better light extraction or passivation layers and n-contacts can be produced.

Further processing is possible until finally the components are separated by separating the auxiliary carrier on chip size structure.

According to at least one embodiment, the auxiliary carrier is made of germanium or silicon or includes germanium or silicon. Alternatively, the auxiliary carrier can be made of sapphire or plastic.

Alternatively, any carrier material can be used as an auxiliary carrier. Adhesive-like materials can be used for wafer bonding (e.g., UV-curing plastics or adhesives).

The inventor has recognized that by using a low temperature wet thermal oxidation process, the substrate can be non-destructively removed from the grown phosphide-based semiconductor layer sequence.

The semiconductor layer sequence can be generated pseudomorphically by organometallic vapor deposition (MOVPE) directly on the substrate. The substrate is preferably a gallium arsenide substrate (001), which can be doped with silicon. It has a 6° orientation in the [$\overline{1}\overline{1}\overline{1}$]-direction. For example, the substrate is 4 inches in diameter or larger.

The wet thermal oxidation can take place in a quartz tube furnace. In wet thermal oxidation, steam can be used which is adjusted with a mass flow controller (MFC). The steam can be preheated, for example, at 120°, and fed into the furnace. In addition, nitrogen can be added as carrier gas.

Embodiments provide an optoelectronic component. The optoelectronic component is preferably produced using the method described here. In this case, all the embodiments and definitions of the method also apply to the component and vice versa.

The method described here applies oxidative detachment to phosphide-based thin-film chips. The thin-film chips are applied to a substrate. The substrate can have a size of 4". Preferably aluminum gallium arsenide is embedded with a gallium content of 0 to 2%, preferably 0.1 to 2%, and with a layer thickness between 300 nm or 600 nm inclusive and 800 nm or 950 nm inclusive between the semiconductor layer sequence and the substrate. Subsequently, the bonding is carried out on an auxiliary carrier, for example, made of germanium and silicon. In other words, oxidative detachment is integrated into the productive process flow. In addition, a reduced chip-compatible oxidation temperature of, for example, 360° with exact process details can be used. No epicracks are generated by the oxidation process and the sacrificial layer. In addition, the method described here can also be used on a larger scale, for example, on a 6" substrate, since only the structured semiconductor layer sequence (depending on the chip size) or the sacrificial layer has to be oxidized laterally and the oxidation is therefore independent of the wafer size.

BRIEF DESCRIPTION OF THE DRAWINGS

Further advantages, advantageous embodiments and further developments result from the exemplary embodiments described in the following in connection with the figures.

FIGS. 3A to 3F show electro-optical properties of an optoelectronic component according to an embodiment;

FIGS. 4A to 4D show electro-optical properties of an optoelectronic component according to an embodiment.

Figure 1A:
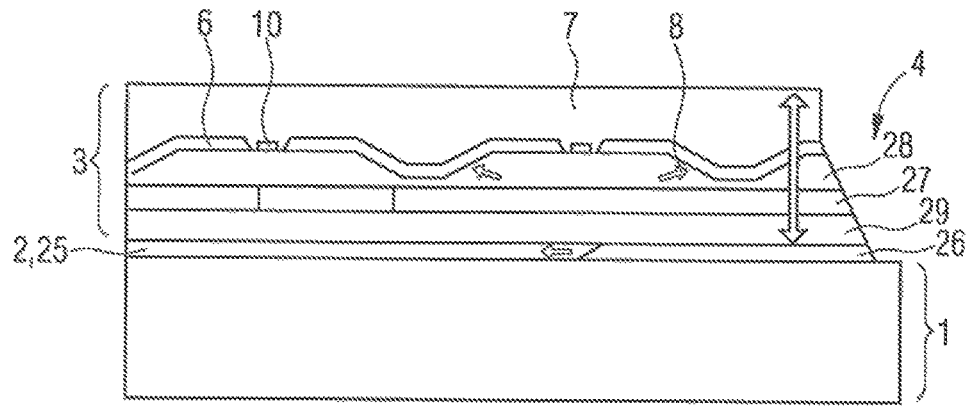
FIGS. 1A to 1C show a method for producing a plurality of optoelectronic components.

In the exemplary embodiments and figures, identical, similar or equivalent elements can each be provided with the same reference numerals. The represented elements and their proportions among each other are not to be regarded as true to scale. Rather, individual elements, such as layers, components, components and areas, can be displayed in an exaggeratedly large format for better representability and/or better understanding.

DETAILED DESCRIPTION OF ILLUSTRATIVE EMBODIMENTS

Figure 1B:
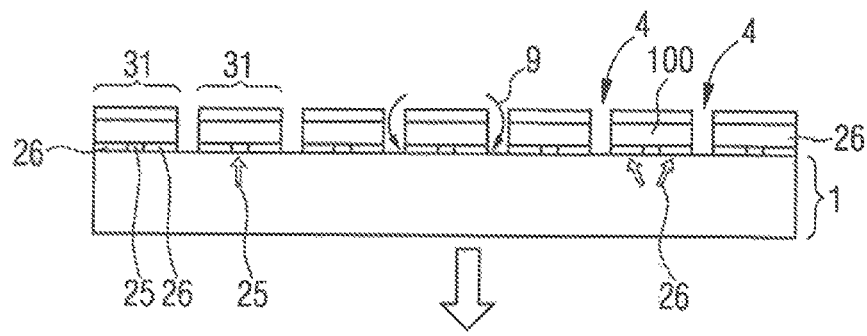
Figure 1C:
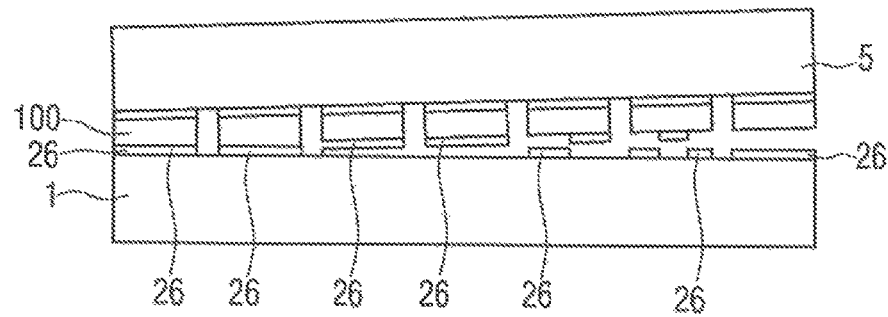

FIGS. 1A to 1C show a method for producing a plurality of optoelectronic components 100 according to an embodiment. The method provides a substrate 1. The substrate may be formed of gallium arsenide. The sacrificial layer 2 is epitaxially applied to substrate 1. The sacrificial layer 2 comprises at least AlAs or aluminum gallium arsenide, preferably with a gallium content of 2%. The semiconductor layer sequence 3 is then applied epitaxially. The semiconductor layer sequence 3 is preferably phosphide based. The semiconductor layer sequence 3 comprises a p-doped semiconductor layer 28, for example, of indium aluminum phosphide, an n-doped semiconductor layer 29, for example, of indium aluminum phosphide, and an active layer 27. The active layer 27 consists of a multiple quantum well structure. The multiple quantum well structure is formed from indium gallium aluminum phosphide. The component may also comprise a buried microreflector (BMR) 8. In addition, the arrangement or each of the components boo may comprise a passivation layer 6, for example, of silicon dioxide. The passivation layer 6 can also be a dielectric 6. The component has a p-contact 10. Above the active layer 27 there can be a metallization 7, for example, of titanium tungsten (N)/titanium/platinum/gold.

In particular, the semiconductor layer sequence is formed as a thin-film chip. In method step C), trenches 4 are created in the vertical direction by the semiconductor layer sequence 3 up to the sacrificial layer 2 or into the sacrificial layer 2. Thus, the sacrificial layer 2 is exposed so that it can be oxidized by wet thermal oxidation in step D). Preferably, the sacrificial layer 2 oxidizes laterally in each case from the side surfaces of the regions of the semiconductor layer sequence 31 in the direction of the center of the respective semiconductor layer sequence 3.

A wet thermal oxidation process during the production of a thin-film chip is therefore incorporated here. The sacrificial layer 2 is arranged between the semiconductor layer sequence 3 and the substrate 1. The sacrificial layer 2 can also be surrounded by additional layers (e.g., GaAs or InGaAlP). In particular, sacrificial layer 2 is located between substrate 1 and semiconductor layer sequence 3. After growth of sacrificial layer 2 and semiconductor layer sequence 3, a hidden microreflector (BMR) can be produced. This can be produced, for example, by dry etching photomasks. This increases the decoupling efficiency. The passivation layer or dielectric 6 can be formed from silicon dioxide. In addition, the semiconductor layer sequence 3 can comprise a mirror metal, for example, gold. The respective component 100 therefore has an increased reflectivity, so that the decoupling efficiency can be increased. The semiconductor layer sequence 3 can have a p-contact 10 of platinum and gold. The dielectric, for example, $SiO_2$, can be structured, e.g., with hydrofluoric acid. In exactly these free etched areas the p-contact metallization can be applied. The passivation layer or dielectric 6 can be structured using hydrofluoric acid. A metallization of titanium tungsten (N)/titanium/platinum/gold can be used to fix the semiconductor layer sequence 3 on an auxiliary carrier 5. A fixed connection between semiconductor layer sequence 3 and auxiliary carrier 5 can thus be created. The chip geometry, i.e., the regions of the semiconductor layer sequence 31, the passivation layer 6 and the epitaxial structures, can be produced by an etching method. The etching method can be generated by means of an inductive coupled plasma (ICP). The trenches 4 extend only up to the sacrificial layer 2 or into the sacrificial layer 2 or through the sacrificial layer 2 up to the substrate 1. In particular, the etching is not done into the substrate 1, because otherwise this is damaged. The surface of the detached substrate 1 would then have to be polished after detachment. In particular, several 100 nm are stopped in front of substrate 1 so that the substrate surface is not damaged.

Thus the sacrificial layer 2 is exposed at the chip side edges and can be oxidized laterally from there. The substrate can be 4" or larger. For wet thermal oxidation, the arrangement can be placed in a quartz tube furnace. The oxidation can take place at 360° for 1.5 hours or less. The temperature can be kept constant at 360°. These process temperatures allow complete oxidation of the sacrificial layer. Preferably, the lateral oxidation of the sacrificial layer is greater than 140 μm. In the subsequent method step, the arrangement can be cooled down after the wet thermal oxidation has been carried out.

The arrangement is preferably cooled down to a temperature of approx. 45° C. before the GaAs substrate with the oxidized layer sequence is removed from the furnace. If the substrate 1 is removed from the furnace at higher temperatures, the different coefficients of thermal expansion of the different epitaxial and metal layers can quickly cause high tensions due to the abrupt cooling of substrate 1 due to removal from the furnace. As a result, the laterally oxidized semi-finished thin-film LEDs can automatically jump off substrate 1 (completely jump away from the wafer).

In particular, they can be cooled to room temperature before the substrate 1 is removed from the furnace.

If the cooling takes place too quickly, cracks may form between the semiconductor layer sequence and the substrate due to the different coefficients of thermal expansion (CTE), which can lead to the destruction of the optoelectronic components.

FIG. 1B shows the wet thermal oxidation of sacrificial layer 2. The oxidation takes place laterally from the semiconductor layer sequence side edges. In particular, the oxidation does not take place completely, so that regions are generated that comprise the oxidized sacrificial layer 26 and the non-oxidized sacrificial layer 25. These regions can still generate an adhesion between the semiconductor layer sequence 3 and the substrate 1. The wet thermal oxidation can take place by means of a steam atmosphere 9. Preferably, the sacrificial layer 2 is completely oxidized, i.e., there are no non-oxidized regions 25.

After step C) or D), an auxiliary carrier 5 can then be applied to the side of the semiconductor layer sequence 3 opposite the substrate 1 (FIG. 1C). The auxiliary carrier 5 can be made of germanium or silicon. A gold tin solder layer may be applied between the auxiliary carrier 5 and the semiconductor layer sequence 3. During bonding, the substrate can be placed in a chamber at a temperature of 200° C. After heating to 250° C., the auxiliary carrier 5 and substrate 1 are pressed together at a pressure of approximately 0.25 MPa. For example, the final bond temperature of 325° C. is maintained at 5 minutes. The arrangement is then cooled and the pressure changed. After the holding time of 5 minutes at 325° C., the bond pressure can be removed, allowing substrate 1 and auxiliary carrier 5 to be cooled without pressure. Due to the low adhesion of the oxidized sacrificial layer 26 to its surrounding elements or layers, for example, the semiconductor layer sequence 3, and/or the substrate 1, the substrate 1 can be easily removed from the semiconductor layer sequence (FIG. 1C). The substrate can be reused and has been non-destructively removed from the semiconductor layer sequence 3. The semiconductor layer sequence 3 on the auxiliary carrier 5 can be used for further process steps.

Figure 2A:
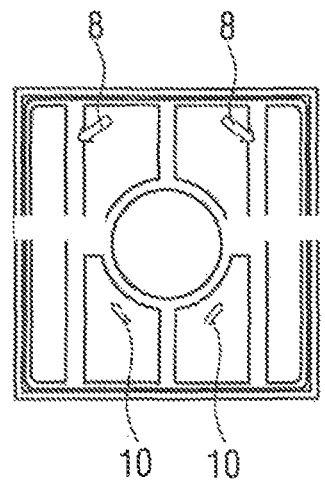
FIGS. 2A to 2F show plan views of an optoelectronic component according to an embodiment.
Figure 2B:
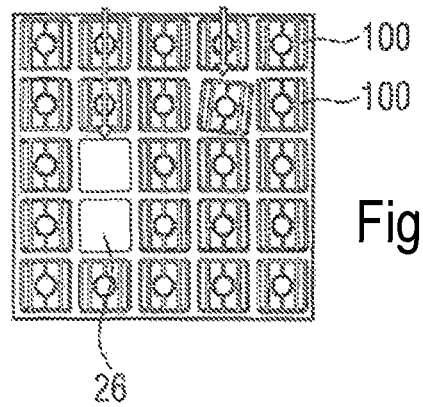

FIGS. 2A to 2F each show a top view of at least one optoelectronic component 100. FIGS. 2A and 2B show a top view of a semi-finished optoelectronic component after step D), so the wet thermal oxidation of the sacrificial layer 2. FIG. 2A also shows the BMR 8 and the p-contact 10. As a result of the oxidation process, the gold bond layer forms polycrystalline grains and small hills. The hills can be observed as small dots on the semiconductor layer sequence surface (FIG. 2A).

FIG. 2B shows a delamination showing the oxidized oxidation layer 26. A crystalline bond between the gallium arsenide substrate 1 and the semiconductor layer sequence 3 is no longer present. By oxidizing the sacrificial layer 2, the substrate 1 can easily be removed from the semiconductor layer sequence 3. In addition, the sacrificial layer 2 can serve as a passivation layer for the surface of the semiconductor layer sequence 3. The sacrificial layer 2 can be removed in the subsequent method step, for example, in the regions of the semiconductor layer sequence 3 that are used for electrical contacting, for example, to form the n-contact 11, or also in the regions where the surface roughening takes place. The surface roughening can enable better light extraction. The amorphous aluminum oxide ($Al_xO_y$, with $0<x<0$ and/or $0<y<0$) or aluminum hydroxide can be selectively removed from ammonia and water (in a ratio of 1:1) by means of an etching solution. The treatment may take 35 minutes. The oxidized sacrificial layer 26 is completely removed and contact layers on the semiconductor layer surface 3 are intact (FIGS. 2E and F).

Figure 2C:
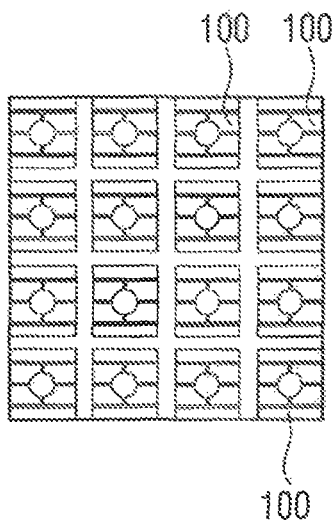
Figure 2D:
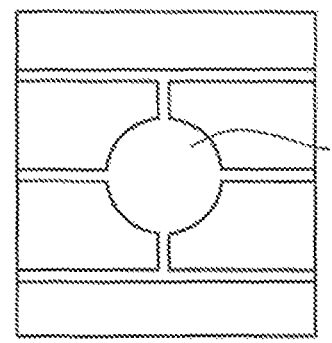
Figure 2E:
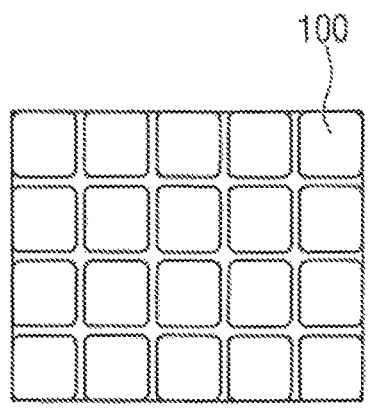
Figure 2F:
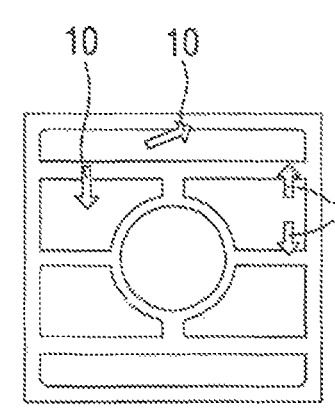

FIGS. 2C and D show a schematic top view of a fully fabricated semiconductor layer sequence 3 with contacts, such as n-contacts ii, and a rough main radiation exit surface.

After method step D), the oxidized sacrificial layer 26 can be removed by etching method, for example, with ammonia and water 1:1. Subsequently, photolithography can be used to create a lacquer structure that serves to structure the areas to be roughened. ICP etching is used to etch the semiconductor surface and roughen it. Then the lacquer structure can be removed again. The semiconductor layer sequence 3 can be passivated, for example, with silicon nitride. The semiconductor layer sequence 3 can have n-contacts ii, for example, made of gold germanium. After applying the gold germanium metallization for the n-contact, the wafer can be heated at elevated temperature. As a result, this n contact alloys into the superficial n contact layers of the semiconductor layer sequence 3, resulting in a good ohmic contact between metal and semiconductor.

FIGS. 3A to 3F show electro-optical characterizations of finished optoelectronic components. The respective optoelectronic component has an auxiliary carrier 5 on which the semiconductor layer sequence 3 is arranged. All finished components are still on the auxiliary carrier 5. The auxiliary carrier 5 with semiconductor layer sequence 3 is not yet isolated.

Figure 3A:
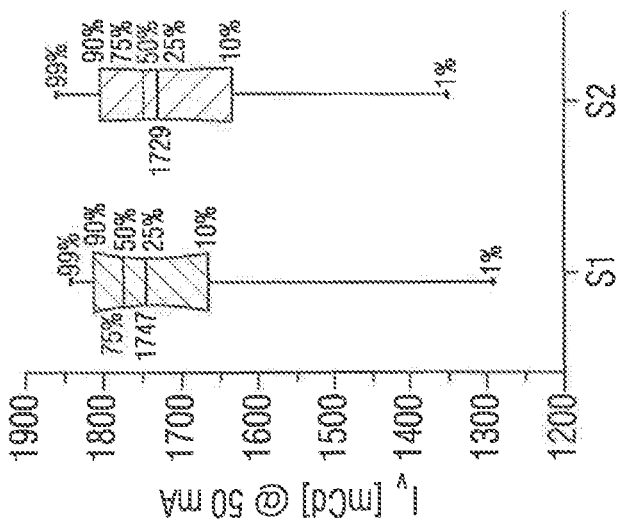
Figure 3B:
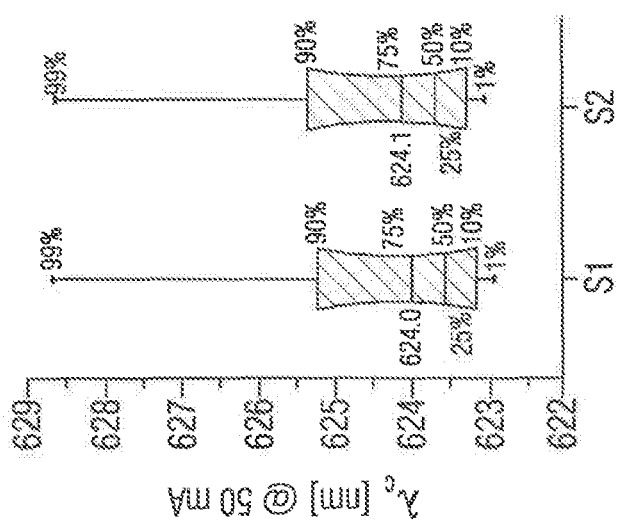
Figure 3C:
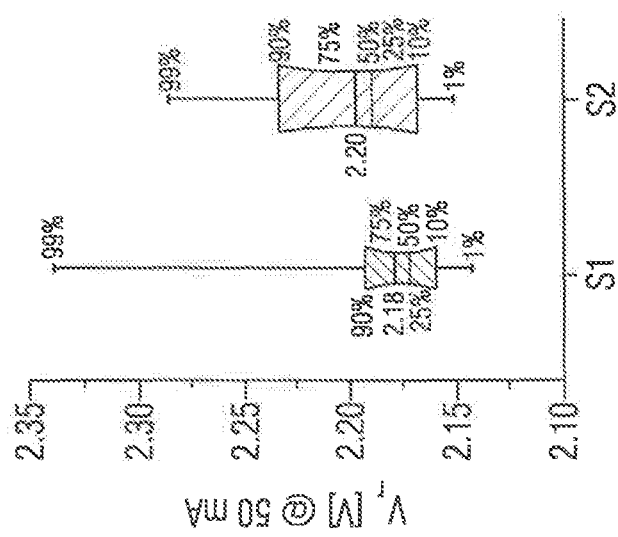

FIG. 3A shows the flux voltage $V_F$ in volts at an applied operating current of 50 mA. FIG. 3B shows the wavelength $\lambda$ in nm at 50 mA. FIG. 3C shows $I_V$ in mCd at 50 mA. $I_V$ is the luminous intensity in mCd (Millicandela) that the chip emits when an operating current of 50 mA is applied to the chip. The FIG. 3D shows $V_{reverse}$ in volts at 10 μA. Here the LED is operated in reverse direction and the blocking voltage or reverse voltage ($V_{reverse}$) is measured when a current of 10 μA flows.

FIG. 3E shows the reverse current or blocking current IR in nA at −12 V and FIG. 3F shows the distribution of the flux voltage Vf of the individual LEDs on a 4-inch wafer of the sample $S_1$. Two samples $S_1$ and $S_2$ are shown in each case. For sample 1 and 2, respectively, approximately 50000 components 100 have been tested. The reverse voltage or blocking voltage of the LED ($V_{reverse}$) was measured on more than 15000 optoelectronic components 100. The values are plotted in a statistical box plot diagram with a specific quantile range between 1% and 99%.

Furthermore, the main values for the measured components 100 and the specific quantile limits in percent for the samples $S_1$ and $S_2$ are given. The samples $S_1$ and $S_2$ are identically constructed, oxidized as well as separated and further processed. The presented results indicate good reproducibility. The high blocking voltage of approximately −59 V and the low leakage current of approximately 77 nA show good stability of the optoelectronic components without electrical shunts.

FIG. 3A)-F) show the measurement results of the LEDs transferred by the oxidation method. It can be shown here that it is possible to transfer thin-film LEDs non-destructively with good chip performance without serious damage using the oxidation method. These LEDs were characterized at wafer level by testing each chip at specific applied currents or voltages. The chip values show comparable results as LEDs produced with the standard method, where the substrate 1 was mechanically ground and chemically etched, destroying the GaAs substrate.

Any type of chip was used and the oxidation method was performed/tested on it. This method can also be applied to other chip types.

FIGS. 4A to 4D show electro-optical properties and rapid aging tests to assess the quality of the LEDs, the finished optoelectronic components 100, each mounted on an auxiliary carrier 5 (depending on FIG. 4A) auxiliary carrier in wafer array, B)-D) auxiliary carrier with LED single and mounted on a printed circuit board).

In FIG. 4A) the LEDs were still measured at wafer level, the LEDs were not yet separated. Separated means that with a saw or a laser the auxiliary carrier is cut through and thus the LEDs are no longer connected to each other via the auxiliary carrier.

In FIG. 4B)-D), the measured LEDs are already isolated and were applied together approx. 30 pieces on a measuring board. These were then subjected to an increased load at increased operating current and temperature in order to force artificial aging, which allows a conclusion to be drawn about the temporal stability of the LED.

Figure 4C:
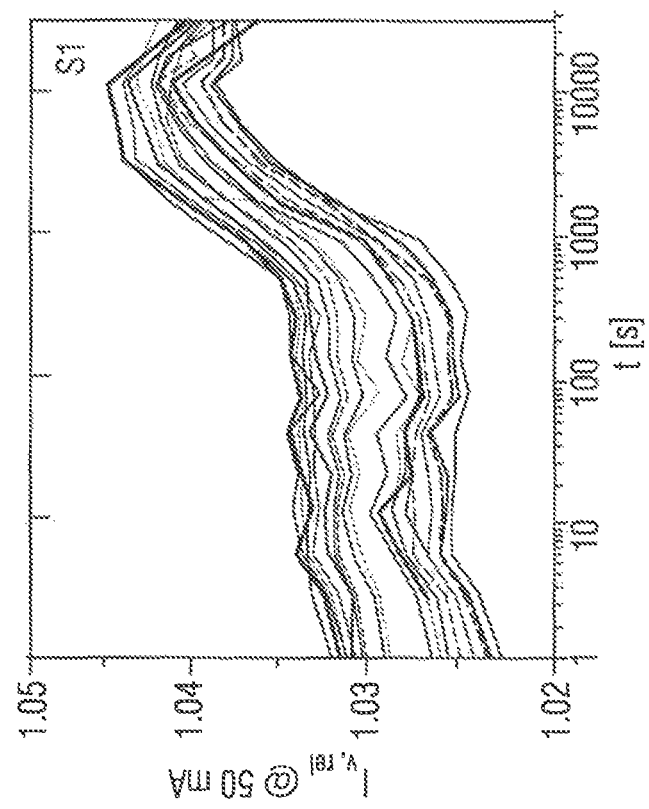
Figure 4D:
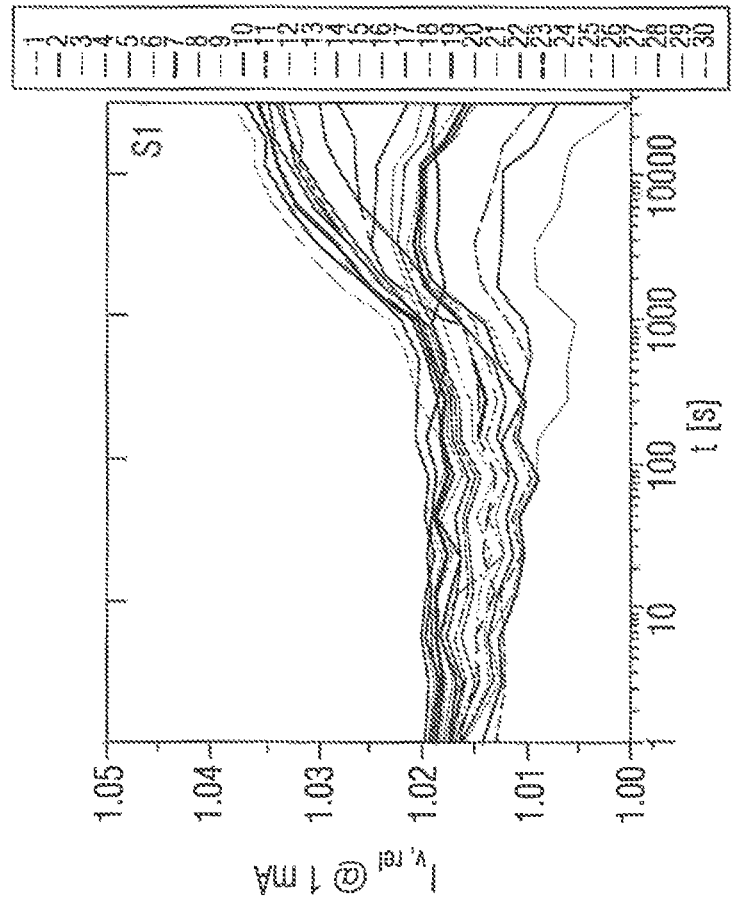

FIG. 4A shows the measured voltage $U_M$ in Volt depending on the applied current $I_A$ in mA of the samples $S_1$, $S_2$ and the reference R. The intensity I as a function of the wavelength $\lambda$ is also shown. FIG. 4B shows the relative forward voltage $V_{f,rel}$ at 50 mA depending on the stress time t in seconds, FIG. 4C shows the luminous intensity $I_{V,rel}$ at 1 mA depending on the stress time t in seconds and FIG. 4D shows $I_{V,rel}$ at 50 mA depending on the stress time t in seconds. $V_{f,rel}$ means that the initial flux voltage was measured at the time 1 s. Then the chip was stressed artificially with increased current and temperature and after certain times (those are the registered points in FIG. 4B)-D)) again the flux tension was measured. These values were plotted at 1 s relative to the initial value. Thus, a percentage increase or decrease of the parameter is represented as a function of the stress time.

This is shown analogously for FIG. 4C) at a measuring current of 1 mA and FIG. 4D) at 50 mA for luminous intensity $I_V$. The different lines show the 30 measured chips 1 to 30.

FIGS. 5A to 5J each show a schematic side view of an optoelectronic component or an epitaxial layer sequence according to an embodiment.

Figure 5A:
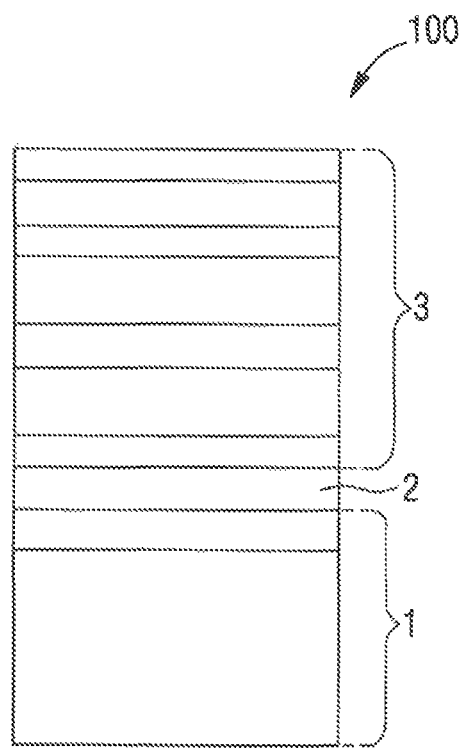
FIGS. 5A to 5J show schematic side views of an optoelectronic component according to an embodiment.

The component 100 or epitaxial layer sequence of FIG. 5A has a substrate 1. The substrate has a layer of gallium arsenide. The gallium arsenide layer may be doped with silicon and may have a layer thickness of 450 μm, for example. Optionally, a gallium arsenide buffer layer (n-doped) can be applied on the gallium arsenide layer. The gallium arsenide buffer layer is part of the substrate 1. Subsequently, sacrificial layer 2 can be applied from aluminum gallium arsenide (n), for example. The aluminum content can be 80%. The sacrificial layer 2 is followed by the semiconductor layer sequence 3. The semiconductor layer sequence comprises, for example, a $Q_{55}$ contact layer (n), followed by a $Q_{100}$ layer (n), followed by quantum troughs, followed by $Q_{100}$ (p), followed by a $Q_{55}$ contact layer (p) and followed by one or two aluminum gallium arsenide layers (p). The aluminum gallium arsenide layers (p) may contain 60% and/or 70% aluminum. The final layer of semiconductor layer sequence 3 may be gallium arsenide (p). P here means p-doped and n here means n-doped.

$Q_{55}$ means $In_{0.5}(Al_{0.275}Ga_{0.225})_{0.5}P$, $Q_{55}$ means that the Al content is 55% and the Ga content is only 45% in the Al—Ga ratio. Al and Ga are only 50% in the structure compared to In (also 50%).

$Q_{100}$ means here that InAlP is present, the Al content compared to Ga is 100%, thus no Ga is present any more.

Figure 5B:
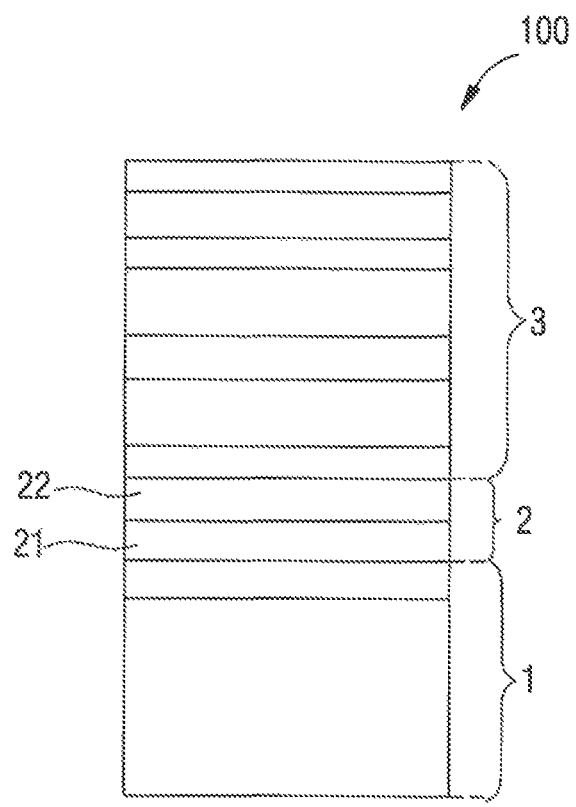

The component of FIG. 5B differs from the component of FIG. 5A in that the sacrificial layer 2 has two sublayers. The first sublayer 21 is formed from AlAs or aluminum gallium arsenide with a content of 2% gallium, for example. The layer thickness, for example, can be 700 nm with a tolerance of 10% to 20% of this value. The sacrificial layer 2 has a second sublayer 22 of gallium arsenide 22. For example, the second sublayer 22 can have a layer thickness of 100 nm.

Figure 5C:
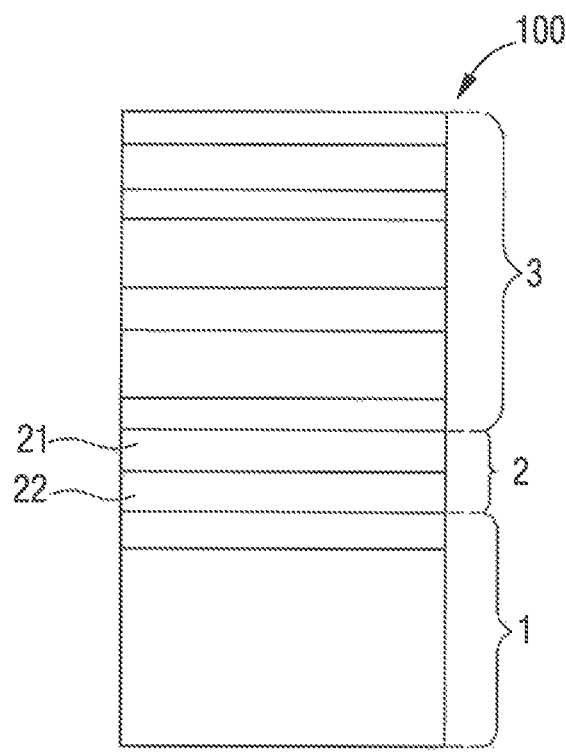

The component of FIG. 5C differs from the component of FIG. 5B in that the sacrificial layer 2 has a $Q_{55}$ layer instead of a gallium arsenide layer. The $Q_{55}$ layer is the second sublayer 22. The second sublayer 22 is directly downstream of the substrate 1. The second sublayer 22 is directly followed by the first sublayer 21, which is formed in particular from aluminum gallium arsenide with a 2% gallium content. The layer thickness of the second sublayer 22 can be 300 nm and the layer thickness of the first sublayer 21 can be 700 nm.

Figure 5D:
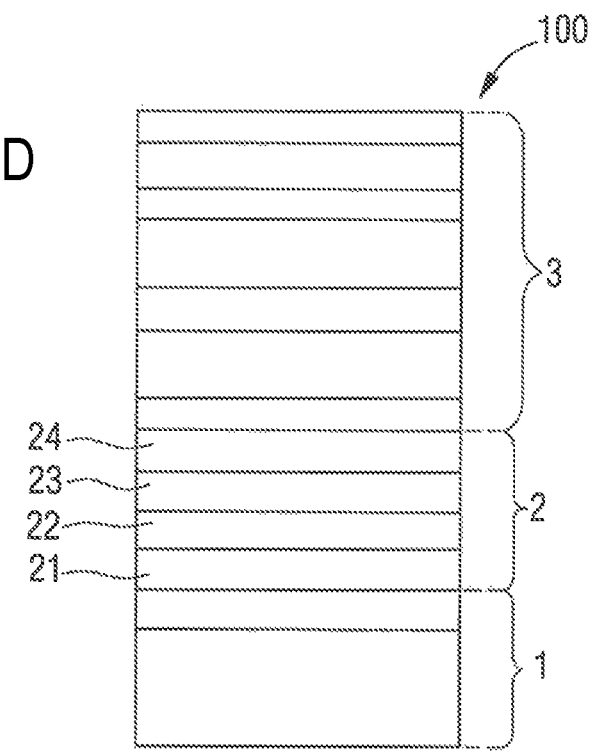

FIG. 5D shows a schematic side view of an optoelectronic component 100 according to an embodiment. This component is the preferred embodiment. The component 100 of FIG. 5D differs from the previous components of FIGS. 5A and 5C in that the sacrificial layer 2 has four sublayers. The first sublayer 21 is directly, so immediate, after the substrate 1. The first sublayer 21 can be formed from $Q_{55}$ with a layer thickness of 300 nm. The second sublayer 22 is directly downstream of the first sublayer 21 and can be formed from gallium arsenide with a layer thickness of <500 nm. The third sublayer 23 is directly downstream of the second sublayer 22 and contains aluminum gallium arsenide, preferably with a gallium content of 2%. The layer thickness of the third sublayer 23 can be 700 nm. In addition, sacrificial layer 2 may have a fourth sublayer 24, which is directly downstream of the third sublayer 23. The fourth sublayer 24 can be formed from gallium arsenide with a layer thickness of 100 nm.

The first sublayer 21 serves here as a protective layer for the substrate 1 and the fourth sublayer 24 can serve here as a protective layer for the semiconductor layer sequence 3. The fourth sublayer 24 can also be missing. In order to be able to perform step D), this means to oxidize the sacrificial layer 2 by wet thermal oxidation, it is advantageous that trenches 4 are created in the vertical direction in the semiconductor layer sequence 3 and the sacrificial layer 2. In other words, the semiconductor layer sequence 2 is structured to chip size. Mesa trenches are created by etching. The trenches 4 can extend into the sacrificial layer 2, preferably into the third sublayer 23 or the second sublayer 24 of the sacrificial layer 2. The trenches 4 can alternatively or additionally extend into the second sublayer 22. The sacrificial layer 2 is then completely free for the oxidation process. After the oxidative separation process, only the gallium arsenide buffer layer and the $Q_{55}$ layer 21 and possibly also the second sublayer 22 of the sacrificial layer 2 are left on the gallium arsenide layer of the substrate 1. These can be selectively removed by means of wet chemical etching, whereby the gallium arsenide of the substrate 1 receives a surface that is suitable for new growth.

Figure 5E:
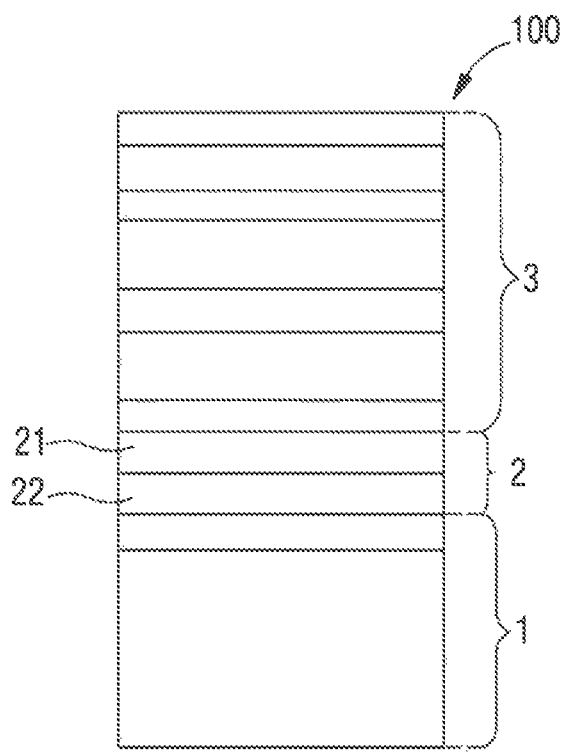

FIG. 5E shows a schematic side view of an optoelectronic component 100 according to an embodiment. The exemplary embodiment of FIG. 5E differs from the exemplary embodiment of FIG. 5A in that the sacrificial layer 2 is constructed differently. In the exemplary embodiment of FIG. 5E, the sacrificial layer 2 comprises a first sublayer 21 and a second sublayer 22. The first sublayer 21 comprises aluminum gallium arsenide, preferably with an aluminum content of 98%. The second sublayer 22 also comprises aluminum gallium arsenide. However, the aluminum content in the second sublayer 22 is lower than the aluminum content in the first sublayer 21. In particular, the aluminum content in the second sublayer 22 is between 10% and 70%, for example, 50%. The second sublayer 22 can then be selectively etched away from the surrounding layers after the separation process has taken place.

The first sublayer 21 preferably comprises a layer thickness between 300 nm and 950 nm. In particular, the second sublayer 22 has a layer thickness of less than 500 nm.

Figure 5F:
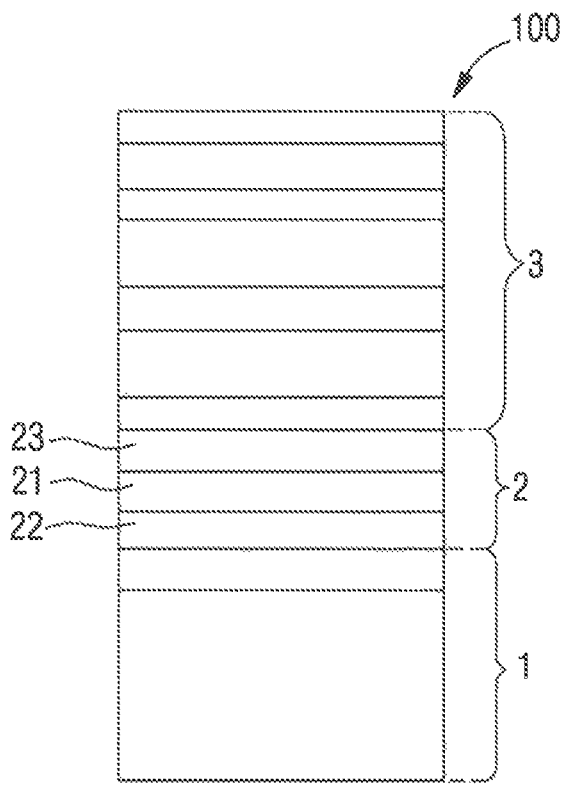

FIG. 5F shows a schematic side view of an optoelectronic component 100 according to an embodiment. The exemplary embodiment of FIG. 5F essentially corresponds to the exemplary embodiment of FIG. 5E with the exception that the sacrificial layer 2 has an additional third sublayer 23. The third sublayer 23 is arranged between the first sublayer 21 and the semiconductor layer sequence 3. The third sublayer 23 preferably consists of the same material as the second sublayer 22. In particular, the third sublayer 23 contains aluminum gallium arsenide with an aluminum content of 10 to 70%. The third sublayer 23 preferably has a layer thickness of less than 200 nm.

Figure 5G:
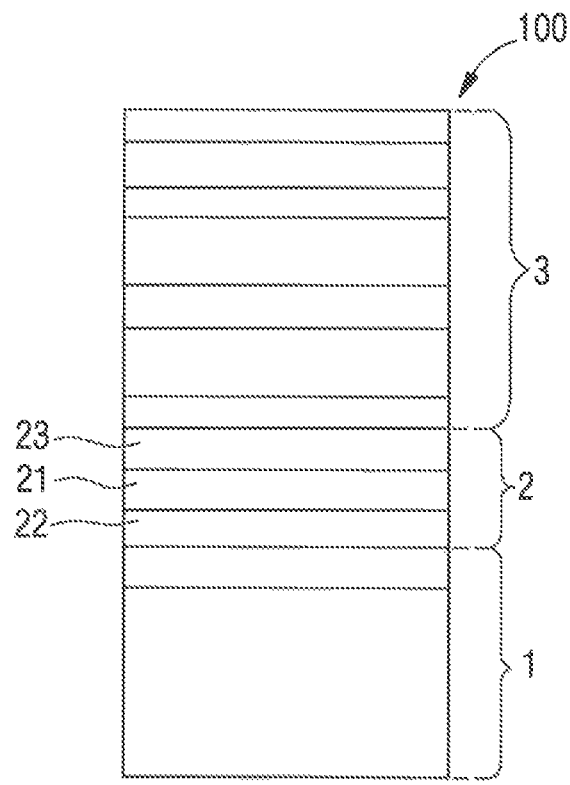

FIG. 5G shows a schematic side view of an optoelectronic component 100 according to an embodiment. The optoelectronic component of FIG. 5G differs from the component of FIG. 5F in that the third sublayer comprises 23 gallium arsenide. Preferably, the thickness of the second sublayer 22 is less than 500 nm. The layer thickness of the first sublayer 21 is preferably between 300 nm and 950 nm and/or that of the third sublayer 23 is approximately 100 nm.

Figure 5H:
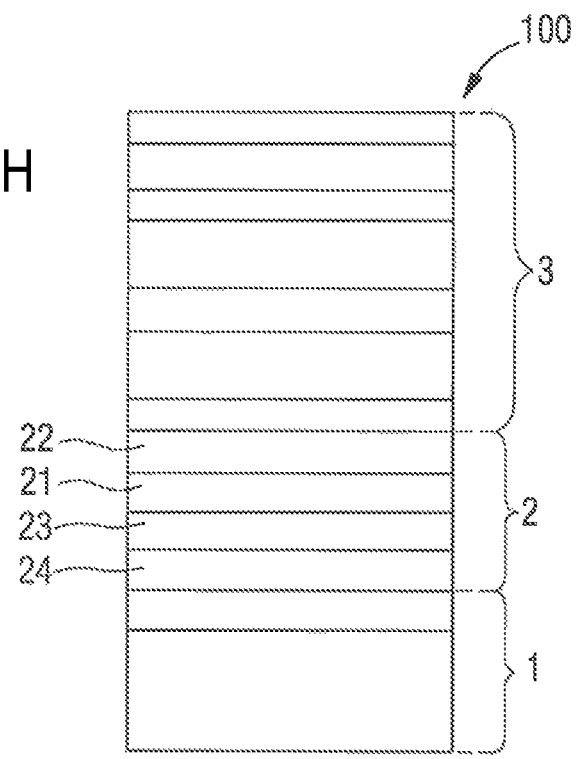

FIG. 5H shows a schematic side view of an optoelectronic component 100 according to an embodiment. The component 100 of FIG. 5H differs from the component of FIG. 5G in that the sacrificial layer 2 is composed of four sublayers. The sacrificial layer 2 of FIG. 5H therefore also comprises a fourth sublayer 24. The fourth sublayer 24 comprises $Q_{55}$. In particular, the thickness of the fourth sublayer 24 is less than 300 nm.

Figure 5I:
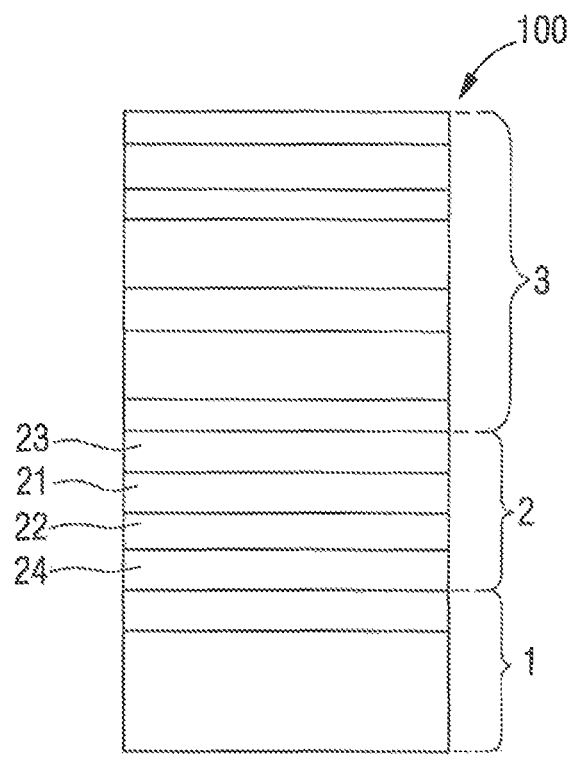

FIG. 5I shows a schematic side view of an optoelectronic component 100 according to an embodiment. The component of FIG. 5I differs from the component of FIG. 5F in that sacrificial layer 2 has an additional fourth sublayer 24. The fourth sublayer 24 is located between substrate 1 and the second sublayer 22. The fourth sublayer 24 preferably comprises $Q_{55}$. The layer thickness of the fourth sublayer 24 is preferably less than 300 nm.

Figure 5J:
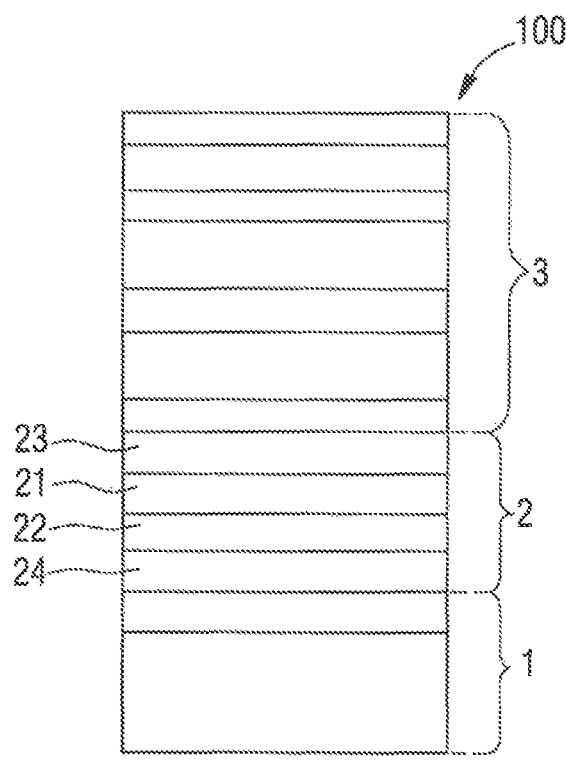

FIG. 5J shows a schematic side view of an optoelectronic component 100 according to an embodiment. The component of FIG. 5J differs from the component of FIG. 5H in the arrangement of the four sublayers 21 to 24 of the sacrificial layer 2. In the direction away from the substrate 1, the sacrificial layer 2 comprises a fourth sublayer 24, subsequently a second sublayer 22, subsequently a first sublayer 21 and subsequently a third sublayer 23. The materials of the sublayers correspond to the materials of the sacrificial layer 2 of FIG. 5H. In other words, the second sublayer 22 and the third sublayer 23 were interchanged. In particular, the layer thickness of the first sublayer 21 is between 300 nm and 950 nm, that of the second sublayer 22 less than 500 nm, that of the third sublayer 23 less than 200 nm and/or that of the fourth sublayer 24 less than 300 nm.

All the arrangements of the component described above can optionally comprise no gallium arsenide buffer layer (n-doped). The content x of aluminum in aluminum gallium arsenide ($Al_xGa_{1-x}As$) of the sacrificial layer 2 is in particular greater than 0 and less than or equal to 1.

The exemplary embodiments described in connection with the figures and their features can also be combined with each other according to further exemplary embodiments, even if such combinations are not explicitly shown in the figures. Furthermore, the exemplary embodiments described in connection with the figures may have additional or alternative features as described in the general part.

The invention is not limited by the description of the exemplary embodiment to these. Rather, the invention includes any new feature and any combination of features, which in particular includes any combination of features in the patent claims, even if that feature or combination itself is not explicitly mentioned in the patent claims.

The invention claimed is:

1. A method of producing a plurality of optoelectronic components, the method comprising:
   providing a substrate;
   epitaxially applying a sacrificial layer on the substrate, wherein the sacrificial layer has a layer thickness greater than 300 nm, and wherein the sacrificial layer comprises $Al_xGa_{(1-x)}As$ with $0<x\leq1$;
   epitaxially applying a semiconductor layer sequence on the sacrificial layer;
   forming trenches extending in a vertical direction through the semiconductor layer sequence to the sacrificial layer such that a plurality of regions in the semiconductor layer sequence is formed; and
   wet thermally oxidizing the sacrificial layer such that the substrate is non-destructively removable from the semiconductor layer sequence,
   wherein the sacrificial layer comprises at least three and optionally four sublayers in a direction facing away from the substrate, a first sublayer comprising InGaAlP, a second sublayer comprising GaAs, a third sublayer comprising $Al_xGa_{(1-x)}As$ with $0<x\leq1$ and a fourth sublayer comprising GaAs.

2. The method according to claim 1, further comprising applying an auxiliary carrier to a side of the semiconductor layer sequence opposite the substrate after forming trenches and after wet thermally oxidizing.

3. The method according to claim 2, wherein the auxiliary carrier is a germanium carrier, a sapphire carrier, a plastic carrier or a silicon carrier.

4. The method according to claim 2, further comprising:
   removing the auxiliary carrier and the semiconductor layer sequence from the substrate; and
   subsequently separating at least the auxiliary carrier so that the plurality of optoelectronic components is obtained.

5. The method according to claim 1, wherein wet thermally oxidizing is carried out at a temperature of less than 400° C. under a steam atmosphere.

6. The method according to claim 1, wherein wet thermally oxidizing comprises only partially oxidizing the sacrificial layer such that there are non-oxidized regions between the semiconductor layer sequence and the substrate comprises $Al_xGa_{(1-x)}As$ with $x\leq1$.

7. The method according to claim 1,
   wherein the first sublayer serves as a protective layer for the substrate and has a layer thickness of 1 nm to 350 nm,
   wherein the second sublayer has a layer thickness of 1 nm to 500 nm, and
   wherein the fourth sublayer serves as a protective layer for the semiconductor layer sequence and has a layer thickness of 1 nm to 120 nm.

8. The method according to claim 1, wherein $0.95\leq x<1$, and wherein the layer thickness of the sacrificial layer is between 600 nm and 800 nm, inclusive.

9. The method according to claim 1, wherein $x=0.98$.

10. The method according to claim 1, wherein the semiconductor layer sequence is a thin film chip.

11. The method according to claim 1, wherein the substrate is GaAs.

12. The method according to claim 1, wherein the sacrificial layer completely oxidizes and an adhesion of the oxidized sacrificial layer is less than an adhesion of the non-oxidized sacrificial layer.

13. An optoelectronic component produced according to the method of claim 1.

14. A method of producing a plurality of optoelectronic components, the method comprising:
   providing a substrate;
   epitaxially applying a sacrificial layer on the substrate, wherein the sacrificial layer has a layer thickness greater than 300 nm, and wherein the sacrificial layer comprises $Al_xGa_{(1-x)}As$ with $0<x\leq1$;
   epitaxially applying a semiconductor layer sequence on the sacrificial layer;
   forming trenches extending in a vertical direction through the semiconductor layer sequence to the sacrificial layer such that a plurality of regions in the semiconductor layer sequence is formed; and
   wet thermally oxidizing the sacrificial layer such that the substrate is non-destructively removable from the semiconductor layer sequence,
   wherein the sacrificial layer comprises at least three and optionally four sublayers in a direction facing away from the substrate, a first sublayer comprising InGaAlP, a second sublayer comprising GaAs, a third sublayer comprising $Al_xGa_{(1-x)}As$ with $0<x\leq1$ and a fourth sublayer comprising GaAs, and
   wherein the first sublayer is arranged on the substrate followed by the second sublayer, the third sublayer and the fourth sublayer in the direction facing away from the substrate.

15. The method according to claim 14, further comprising:
   applying an auxiliary carrier to a side of the semiconductor layer sequence opposite the substrate after forming trenches and after wet thermally oxidizing;
   removing the auxiliary carrier and the semiconductor layer sequence from the substrate; and
   subsequently separating at least the auxiliary carrier so that the plurality of optoelectronic components is obtained.

16. The method according to claim 14, wherein wet thermally oxidizing is carried out at a temperature of less than 400° C. under a steam atmosphere.

17. The method according to claim 14, wherein $0.95 \leq x < 1$, and wherein the layer thickness of the sacrificial layer is between 600 nm and 800 nm, inclusive.

* * * * *